United States Patent [19]
Coussot et al.

[11] 3,972,011
[45] July 27, 1976

[54] SURFACE ELASTIC WAVE ELECTROMECHANICAL DEVICE

[75] Inventors: Gérard Coussot; Olivier Menager, both of Paris, France

[73] Assignee: Thomson-CSF, Paris, France

[22] Filed: July 8, 1975

[21] Appl. No.: 594,088

[30] Foreign Application Priority Data
July 12, 1974 France............................ 74.24364

[52] U.S. Cl. ............................. 333/30 R; 310/8.1; 310/9.8; 333/72
[51] Int. Cl.²..................... H03H 9/26; H03H 9/32; H01L 41/08
[58] Field of Search................ 333/30 R, 72; 310/8, 310/8.1, 8.2, 9.8

[56] References Cited
UNITED STATES PATENTS

| | | |
|---|---|---|
| 3,872,410 | 3/1975 | Zucker.................. 333/72 |
| 3,908,137 | 9/1975 | Hunsinger et al............. 333/30 R X |

*Primary Examiner*—Alfred E. Smith
*Assistant Examiner*—Marvin Nussbaum
*Attorney, Agent, or Firm*—Cushman, Darby & Cushman

[57] ABSTRACT

The present invention relates to surface elastic wave electromechanical devices. The electromechanical device in accordance with the invention comprises a central common transducer and two identical transducers interconnected electrically. The central transducer produces bi-directional radiation, and intermediate means are provided to selectively modify the propagation of the surface elastic waves.

10 Claims, 5 Drawing Figures

SURFACE ELASTIC WAVE ELECTROMECHANICAL DEVICE

The present invention relates to delay lines and to electromechanical filters constituted by a substrate the top face of which carries electromechanical transducers designed to emit and receive surface elastic waves such as Rayleigh waves.

In a typical embodiment, these devices comprise two sets of electrodes in the form of interdigitated comb shaped structures deposited at the surface of a piezoelectric substrate, for example a substrate of lithium niobate. A voltage which is to be filtered or delayed is applied to one of the sets of electrodes in order to produce emission of radiation in the form of surface elastic waves. This radiation is received by the other set of electrodes which produces an induced voltage whose characteristics depend upon the vibrational mode transmitted and upon the particular configuration of the transducer combs.

Those skilled in the art will be aware that mechanical vibrations can propagate through a solid body in the form of bulk waves and that it is necessary to adopt measures in surface elastic wave devices in order to ensure that this transmission mode does not disturb operation.

To prevent the unwanted transmission of bulk waves, it is well-known to utilise in a surface elastic wave device, a coupler constituted by parallel conductive elements. This coupler introduces decoupling into the trajectory followed by the surface waves, which enables the transducers performing the emission and reception functions to be offset. This decoupling only affects the surface waves and accordingly the offset in the transducers makes it possible to reduce the energy exchange taking place in the form of bulk waves.

However, this solution has the drawback that it increases the lateral bulk of the surface elastic wave devices. Furthermore, the coupler introduces attenuation in the transmission function and gives rise to wave reflections associated with the formation of bulk waves. Finally, the emission and reception transducers are operated in just one of their two radiation directions, and this is a supplementary cause of attenuation.

In order to overcome these drawbacks, it is the proposal of the present invention that the transmission of bulk waves should be inhibited by the opposed effects of two arms common to which there is a transducer producing bi-directional radiation. Two identical transducers arranged at the ends of the two arms are interconnected in such a fashion that they receive the disturbing signals transmitted through the volume of the substrate, in anti-phase. By contrast, the effective signals are placed in a cophasal relationship thanks to the presence of intermediate means located at the surface of the substrate and acting selectively upon the propagation characteristics of the surface elastic waves.

In accordance with the present invention there is provided an electromechanical surface elastic wave device for transmitting an electrical signal from one pair of terminals to a further pair of terminals, said device comprising: a substrate having a face for propagating surface elastic waves, and first and second electromechanical transducer means arranged at said face and respectively connected to said one pair and said further pair of terminals; said first and second electromechanical transducer means being arranged to effect selective energy transfer through the medium of said surface elastic waves; said first electromechanical transducer means comprising two identical transducer structures having a common radiation axis and separated from one another by an interval; said second electromechanical transducer means comprising a further transducer structure producing bi-directional radiation along said radiation axis; said further transducer structure being arranged in said interval midway between said identical transducer structures thereby providing two opposed arms transmitting said surface elastic waves in opposite directions; at least one of said opposed arms being equipped with intermediate means selectively changing the propagation characteristics of said surface elastic waves; the interconnection of said identical transducer structures ensuring in the absence of said intermediate means substantially zero electrical energy transfer between said one pair and said further pair of terminals.

For a better understanding of the present invention and to show how the same may be carried into effect, reference will be made to the ensuing description and the attached figures among which:

In FIG.. 1, there can be seen a surface elastic wave electromechanical device in accordance with the invention. In the present instance and by way of non-limitative example, this device is a band-pass filter having a pair of input terminals 17–18 and a pair of output terminals 16–15. This filter is constituted by a substrate 2 at the surface 1 of which surface elastic waves can propagate.

Figure 1:
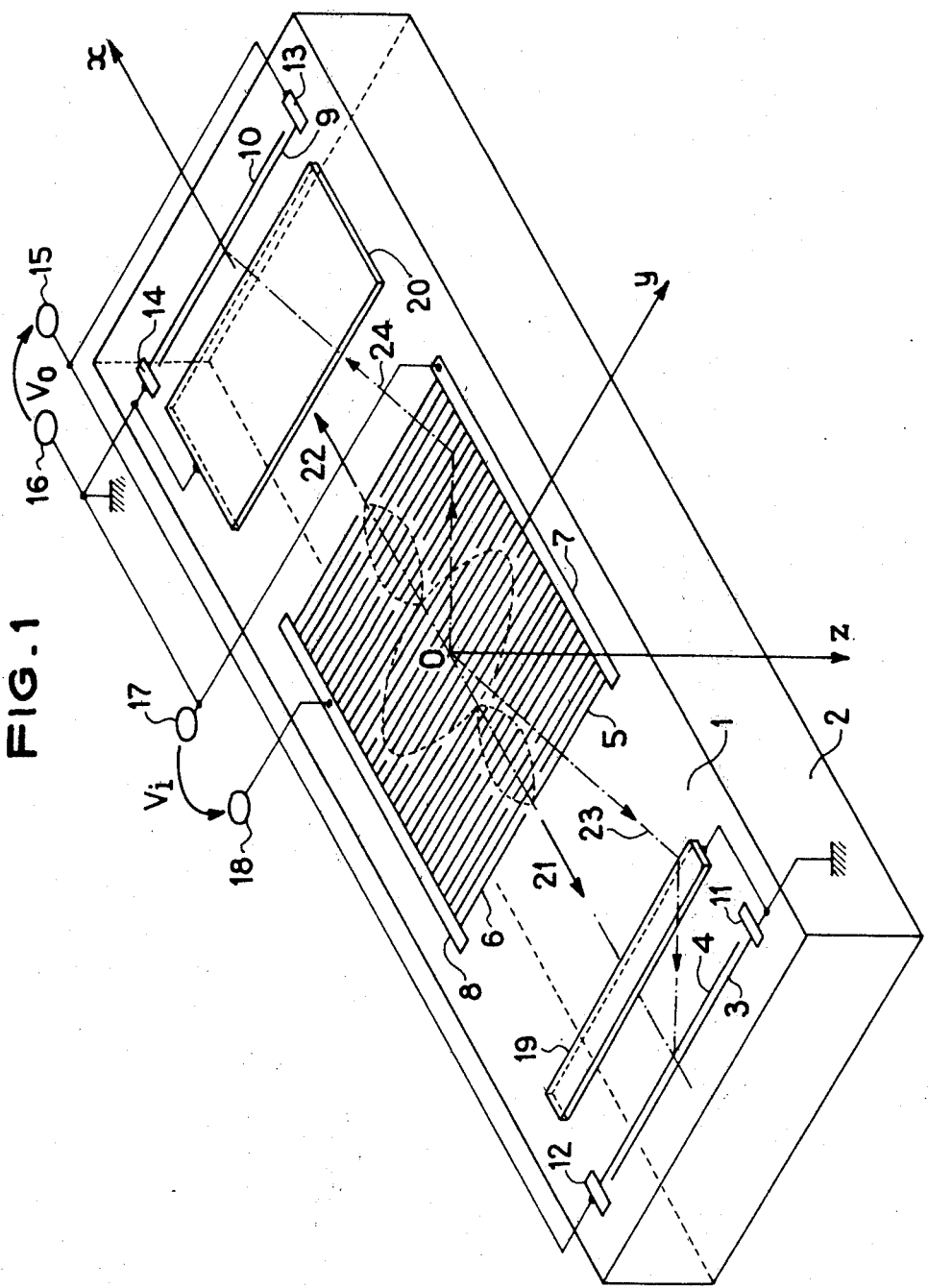
FIG. 1 is an isometric view of an electromechanical device in accordance with the invention.

For ease of description, in FIG. 1 a system Oxyz of axes has been illustrated. The surface 1 of the substrate 2 contains the axes $x$ and $y$ and the propagation of the surface elastic waves takes place in positive and negative directions along the $x$ axis.

The substrate 1 will for example be cut from a piezoelectric material such as lithium niobate. An emitter transducer is located at the centre 0 of the surface 1 and is constituted by a set of electrodes of interdigitated comb type. The common edges 7 and 8 of the combs are connected to the terminals 17 and 18 and their teeth 5 and 6, which are of dissimilar lengths, delimit a pattern of rectilinear, radiating intervals. The radiating intervals are orientated parallel to the axis $y$ and are delimited laterally by the two envelopes marked in dashed line, which pass through the gap zones between the teeth 5 and 6. If an alternating voltage $V_i$ of frequency $f$ is applied across the terminals 17 and 18 of the filter, the transducer assembly 5, 6, 7, 8 in association with the piezo-electric substrate, emits vibrational radiations 21 and 22 which propagate at the surface 1 of the substrate towards two identical reception transducers located respectively at the two ends of said surface. The reception transducers likewise comprise electrodes in the form of interdigitated comb structures. The surface elastic wave 21 is picked up by the radiating interval defined between the teeth 3 and 4. The surface elastic wave 22 is picked up by the radiating interval defined between the teeth 9 and 10. By construction, the emission transducer 5, 6, 7, 8 is a bi-directional transducer and the waves 21 and 22 are identical with the exception of their directions of propagation. The two reception transducers 3–4 and 9–10 are disposed symmetrically in relation to the center 0 of the emission transducer and their conductive edges 11, 12, 13 and 14 are interconnected and taken to the output terminals 15 and 16. The interconnection illustrated in FIG. 1 is such that the surface waves induce voltages $V_o$ in anti-phase, if the substrate 2 propagates the waves at uniform velocity. The same thing happens in the case of the bulk waves 23 and 24 propagating through the depth of the substrate 2. In consequence, if the substrate is uniform and if its surface 1 carries nothing more than the three transducers referred to earlier, then the filter consists of two opposed arms interconnecting the pairs of terminals 15–16 and 17–18, no exchange of electrical energy being possible between these two pairs of terminals.

To re-establish an effective exchange of electrical energy between the pairs of terminals 15–16 and 17–18, the invention provides for the interposing in at least one of the two arms of the filter, of intermediate means which make it possible to selectively modify the propagation characteristics of the surface elastic waves.

In FIG. 1, these intermediate means are constituted by conductive layers 19 and 20 deposited upon the surface 1 of the substrate. In principle, a single conductive layer will suffice to modify the phase velocity of the surface waves in one of the two arms of the filter. In practice, it is preferable to use a conductive layer in each arm of the filter so that by earthing it, it further acts as an electrostatic screen. Self-evidently, it is then necessary for the two layers 19 and 21 to produce dissimilar modifications in the phase of the surface waves 21 and 22. It is for this reason that, in FIG. 1, the layer 19 is narrower than that 20. Since the interposed layers 19 and 20 are located upon the surface 1 of the substrate 2, they do not affect the propagation of the bulk waves 23 and 24 so that these latter produce no resultant voltage between the terminals 15 and 16.

In order for the surface waves 21 and 22 to induce a maximum resultant voltage between the terminals 15 and 16, it is necessary for these waves to be picked up by the end transducers in anti-phase and without attenuation. Accordingly, it is necessary to choose layers 19 and 20 which produce little attenuation in the surface waves and introduce a differential phase-shift of $\pi$ between the two arms of the filter. These layers may for example be constituted by a deposit of aluminum which, due to the short-circuiting of the electric field of the substrate, produces a reduction in the propagation velocity of the surface waves. A sharper reduction in the propagation velocity can be achieved by substituting gold for the aluminum since this heavy metal also increases the inertia mass of the propagation medium.

Generally speaking, the positioning of the two identical reception transducers, and their electrical interconnection, should be such that they ensure substantially zero electrical energy interchange in the absence of any intermediate means designed to modify the propagation of the surface elastic waves. It is then merely necessary to incorporate at the surface, means which will reestablish an electrical energy exchange between the two pairs of terminals of the filter; these interposed means can influence the amplitude and/or one phase of the surface waves. It goes without saying that the two terminal transducers could be of the kind producing unidirectional radiation, and that is not necessary for them to be of the interdigitated kind. The central transducer produces bi-directional radiation and should radiate in the same way in both directions.

The filter shown in FIG. 1 could equally well operate using the terminals 15 and 16 for the signal input and the terminals 17 and 18 for the output. Moreover, the terminal transducers could have teeth of dissimilar lengths, in the same way as the central transducer.

Figure 2:
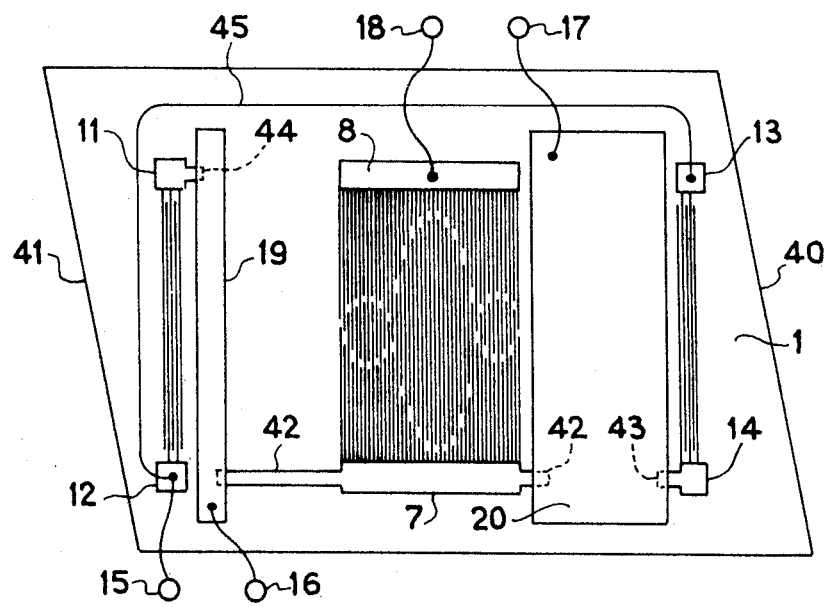
FIG. 2 is a plan view of a filter device in accordance with the invention.

In FIG. 2, there can be seen a plan view of an electromechanical filter of the kind used in practice to filter the video frequency signals in an intermediate frequency amplifier employed in a television receiver.

The substrate is cut from a wafer of lithium niobate. Cutting is carried out using a sand jet, to give a parallelogram contour. On the top, smooth face 1 there are deposited sets of electrodes constituting the transducer combs. The edges of the combs, 11, 7 and 13, are equipped with extensions 44, 42 and 43 which make it possible to earth the intermediate means 19 and 20 deposited later on. The deposition of the intermediate bands 19 and 20 is carried out by evaporation under vacuum or sputtering, using the conventional masking technique. In the example in question, we are concerned with aluminum bands overlapping the conductive extensions 42, 44 and 43, so that they are earthed directly. All that remains is to interconnect the edges 12 and 13 of the terminal transducers and to connect these edges to the input and output terminals. For convenience of description, the references used are the same as those employed in FIG. 1.

In FIG. 2, it is the central transducer which, by virtue of its special configuration, defines the characteristic of the filter. Those skilled in the art will appreciate that the transfer function of a filter is the Fourier transform of the pulse response obtained when the filter is excited by a Dirac pulse, and that in order to synthesise this response sampling is used.

Figure 3:
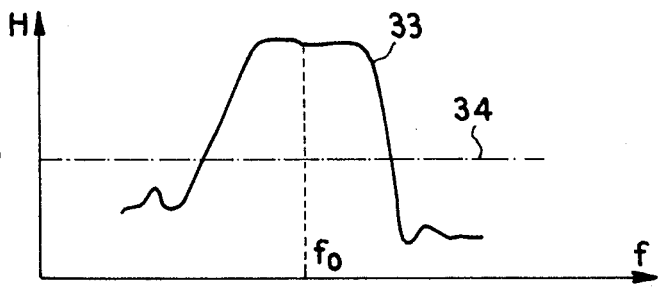
FIG. 3 is an explanatory diagram representing the transfer function of the filter shown in FIG. 2.

The samples are produced by the radiation coming from the successive radiating intervals of non-uniform length, which make up the central transducer. As FIG. 2 shows, the comb structures of the central transducer are produced using a pattern of conductive filaments which electrically links the edges 7 and 8. Each filament is interrupted so that its sections form the teeth of comb structures. The envelope curves passing through the gaps in the conductive filaments of the central comb structure, determine the transfer function $H(f)$ of the filter. The graphs 33 of FIG. 3 illustrates this transfer function and it will be seen that we are dealing here with a band-pass filter whose centre frequency is fo. The level 34 is that which the parasitic signals generated by the bulk waves, reach. This level is substantially reduced by virtue of the compensating technique employed in accordance with the invention. On the other hand, it will be observed that the transmission factor within the pass band is high since the filter utilises the two waves radiated in opposite directions by the central transducer.

If the filter characteristic required so permits, the configuration of the comb structures may accord with a symmetrical pulse response and in this case it is the central transducer producing the bi directional radiation, which will advantageously possess this configuration. If the pulse response required is not symmetrical, the corresponding configuration of the comb structures cannot be applied to the central transducer and it is then necessary to apply it to the two terminal transducers. By way of example, in FIG. 2, in order to filter a video-frequency signal of some tens of megahertz, the distance separating the terminal comb structures is in the order of one centimeter and the wavelength of the surface elastic waves is around 150 microns for a lithium niobate substrate.

As far as the interposed means designed to modify the phase velocity or amplitude of the surface elastic waves, are concerned, it is possible to have recourse to any means capable of producing this kind of modification of the propagation characteristics.

Figure 4:
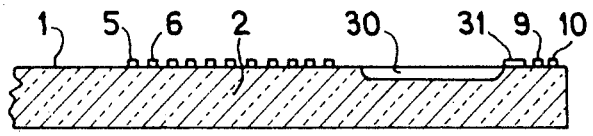
FIGS. 4 and 5 illustrate in partial section variant embodiments of the device in accordance with the invention.

It is possible for example, as the partial section of FIG. 4 shows to form between the central transducer 5, 6 and the terminal transducer 9, 10 a depression 30 produced by ionic erosion of the surface 1 of the substrate.

Since this depression does not provide electrostatic screening of the transducers, a conductive band 31 for earthing purposes may be deposited in proximity of the terminal transducer.

Figure 5:
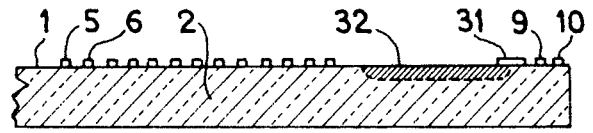

In FIG. 5, another variant embodiment of the intermediate means can be seen, which consists in utilising ion implantation in order to locally modify the physical properties of the substrate 2. Commencing, for example, from a substrate cut from a quartz crystal, it is possible by ion implantation to create an amorphous zone 32 in which the surface elastic waves propagate more rapidly than in the adjacent crystalline zones. In order to provide the electrostatic screening, a conductive band 31 which is earthed, can also be provided.

Although the aforegoing description deals solely with the case of electromechanical filters, it is equally possible to apply the principle of the invention to the case of a surface elastic wave delay line as well as to any surface wave device intended to process coded electrical signals by matched filtering.

What we claim is:

1. An electromechanical surface elastic wave device for transmitting an electrical signal from one pair of terminals to a further pair of terminals, said device comprising: a substrate having a face for propagating surface elastic waves, and first and second electromechanical transducer means arranged at said face and respectively connected to said one pair and said further pair of terminals; said first and second electromechanical transducer means being arranged to effect selective energy transfer through the medium of said surface elastic waves; said first electromechanical transducer means comprising two identical transducer structures having a common radiation axis and separated from one another by an interval; said second electromechanical transducer means comprising a further transducer structure producing bi-directional radiation along said radiaton axis; said further transducer structure being arranged in said interval midway between said identical transducer structures thereby providing two opposed arms transmitting said surface elastic waves in opposite directions; at least one of said opposed arms being equipped with intermediate means selectively changing the propagation characteristics of said surface elastic waves; the interconnection of said identical transducer structures ensuring in the absence of said intermediate means substantially zero electrical energy transfer between said one pair and said further pair of terminals.

2. A device as claimed in claim 1, wherein said intermediate means comprise at least one conductive band deposited upon said face between said further transducer structure and one of said identical transducer structures.

3. A device as claimed in claim 1, wherein said intermediate means comprise at least one depression zone formed by ion erosion of said face; said depression zone being located between said further transducer structure and one of said identical transducer structures.

4. A device as claimed in claim 1, wherein said intermediate means comprise at least one zone having modified physical characteristics; said zone being formed beneath said surface by ion implantation and being located between said further transducer structure and one of said identical transducer structures.

5. A device as claimed in claim 1, further comprising electrostatic screening means located between said transducer structures.

6. A device as claimed in claim 1, wherein at least one of said transducer structures is constituted by a set of electrodes in the form of interdigitated comb structures.

7. A device as claimed in claim 1, wherein said substrate is made of a piezo-electric material.

8. A device as claimed in claim 6, wherein the teeth of said comb structures have dissimilar lengths for forming a succession of dissimilar, rectilinear radiating intervals delimited by the mutually opposite portions of said teeth.

9. A device as claimed in claim 5, wherein said electrostatic screening means are constituted by said intermediate means.

10. A device as claimed in claim 1, wherein said intermediate means introduce between said opposed arms a differential phase shift in said surface elastic waves, substantially equal to $\pi$.

* * * * *